United States Patent
Li et al.

(10) Patent No.: US 9,905,493 B2
(45) Date of Patent: Feb. 27, 2018

(54) ARRAY SUBSTRATE AND ACTIVATION METHOD FOR TFT ELEMENTS IN ARRAY SUBSTRATE

(71) Applicant: Wuhan China Star Optoelectronics Technology Co., Ltd., Wuhan (CN)

(72) Inventors: Yafeng Li, Wuhan (CN); Xiangyi Peng, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 257 days.

(21) Appl. No.: 14/914,655

(22) PCT Filed: Jan. 28, 2016

(86) PCT No.: PCT/CN2016/072434
§ 371 (c)(1),
(2) Date: Feb. 29, 2016

(87) PCT Pub. No.: WO2017/107287
PCT Pub. Date: Jun. 29, 2017

(65) Prior Publication Data
US 2018/0033712 A1 Feb. 1, 2018

(30) Foreign Application Priority Data
Dec. 22, 2015 (CN) .......................... 2015 1 0974140

(51) Int. Cl.
*G02F 1/133* (2006.01)
*H01L 23/34* (2006.01)
(Continued)

(52) U.S. Cl.
CPC .......... *H01L 23/345* (2013.01); *H01L 27/124* (2013.01); *H01L 27/1222* (2013.01);
(Continued)

(58) Field of Classification Search
None
See application file for complete search history.

(56) References Cited

U.S. PATENT DOCUMENTS

2012/0182274 A1* 7/2012 Nakahara .......... G02F 1/136213
345/204
2016/0254292 A1* 9/2016 Shen .................... H01L 27/1259
438/104

FOREIGN PATENT DOCUMENTS

CN    CN103926726 A    7/2014

* cited by examiner

*Primary Examiner* — Cassandra Cox
(74) *Attorney, Agent, or Firm* — Leong C. Lei

(57) ABSTRACT

The invention provides an array substrate and activation method for TFT elements in the array substrate. The array substrate comprises a shielding metal layer (10) and a TFT layer (20) disposed on the shielding metal layer (10); by connecting the shielding metal blocks (11) on the shielding metal layer (10) to electricity to heat up the shielding metal blocks (11) for pre-heating the TFT layer (20) to accelerate activating the TFT elements in the TFT layer (20). The activation method, by connecting the shielding metal blocks (11) on the shielding metal layer (10) to electricity to heat up the shielding metal blocks (11) for pre-heating the TFT layer (20) before activating the TFT elements in the TFT layer (20), accelerates activating the TFT elements in the TFT layer (20). The method is applicable to activating the TFT elements in array substrate in low temperature environment.

12 Claims, 3 Drawing Sheets

(51) Int. Cl.
 *H01L 27/12* (2006.01)
 *H01L 29/786* (2006.01)
 G02F 1/1362 (2006.01)
 G02F 1/1368 (2006.01)
 G02F 1/1333 (2006.01)
(52) U.S. Cl.
 CPC .... *H01L 27/1255* (2013.01); *H01L 29/78633* (2013.01); *H01L 29/78672* (2013.01); G02F 1/1368 (2013.01); G02F 1/133382 (2013.01); G02F 1/136209 (2013.01); G02F 2202/104 (2013.01)

ARRAY SUBSTRATE AND ACTIVATION METHOD FOR TFT ELEMENTS IN ARRAY SUBSTRATE

BACKGROUND OF THE INVENTION

1. Field of the Invention

The present invention relates to the field of display, and in particular to an array substrate and an activation method for thin film transistor (TFT) elements in array substrate.

2. The Related Arts

The thin film transistor (TFT) is the main driving element in the liquid crystal display (LCD) and active matrix organic light-emitting diode (AMOLED) display, and is directly related to the development trend of the high performance tablet displays.

The low temperature poly-silicon (LTPS) is the latest TFT substrate manufacturing technology, differs from the conventional a-Si technology mainly in that the LPTS display has the advantages of fast response, high luminance, high resolution and low energy-consumption.

The northern part of China may experience winter as cold as −40° C. The users in these areas, when powering on electronic display, often experience slow response from the display, abnormal or delayed display images. The analysis shows that the reason lies in the low temperature. In low temperature condition, the electrons in the LTPS-TFT elements slow down in the carrier movement, leading to delay. FIG. 1 is a schematic view of the array substrate of a known LCD panel. The array substrate comprises a bottom substrate 100, a shielding metal layer 200 disposed on the bottom substrate 100, a TFT layer 300 disposed on the shielding metal layer 200; wherein the TFT layer 300 comprising a plurality of TFTs 310, the shielding metal layer 200 comprising a plurality of shielding metal blocks 210 corresponding respectively to the plurality of TFTs 310. The plurality of shielding metal blocks is mutually independent and disconnected. The known LCD panel is easily delayed when activated in low temperature environment.

Therefore, it is imperative to devise an array substrate and activation method for TFT elements in array substrate to address the above problem.

SUMMARY OF THE INVENTION

The object of the present invention is to provide an array substrate, which is able to realize fast activation of TFT elements in low temperature environment.

Another object of the present invention is to provide an activation method for TFT elements in array substrate, which is able to realize fast activation of TFT elements in low temperature environment.

To achieve the above object, the present invention provides an array substrate, which comprises: a bottom substrate, a shielding metal layer disposed on the bottom substrate, and a TFT layer disposed on the shielding metal layer;

the shielding metal layer comprising a plurality of shielding metal blocks arranged in a matrix divided into m rows, with the plurality of shielding metal blocks of each row connected through a wire;

in the m rows of shielding metal blocks, n rows forming a group, wherein 1≤n≤m, two wires being used to connected respectively the left ends and the right ends of the n rows of shielding metal blocks to form a plurality of parallel combinations, so that the two ends of each parallel combination having two outward extending wires, by connecting the two wires to a power source to supply electricity to the parallel combination to make the plurality of shielding metal blocks generating heat to pre-heat the TFT layer for accelerating activation of the TFT elements in the TFT layer.

The TFT layer comprises a plurality of TFTs disposed correspondingly to the plurality of shielding metal blocks of the shielding metal layer, i.e., each TFT is correspondingly on top of a shielding metal block.

The TFT is a LTPS TFT.

The number of rows of shielding metal blocks in the plurality of parallel combinations is the same or different.

The shielding metal layer comprises m/2 parallel combinations, wherein each parallel combination comprises two rows of shielding metal blocks.

The present invention also provides an activation method for TFT elements in array substrate, which comprises:

Step 1: providing an array substrate, the array substrate comprising: a bottom substrate, a shielding metal layer disposed on the bottom substrate, and a TFT layer disposed on the shielding metal layer;

the shielding metal layer comprising a plurality of shielding metal blocks arranged in a matrix divided into m rows, with the plurality of shielding metal blocks of each row connected through a wire;

in the m rows of shielding metal blocks, n rows forming a group, wherein 1≤n≤m, two wires being used to connected respectively the left ends and the right ends of the n rows of shielding metal blocks to form a plurality of parallel combinations, so that the two ends of each parallel combination having two outward extending wires;

Step 2: connecting the two wires to a power source to supply electricity to the parallel combination to make the plurality of shielding metal blocks generating heat to pre-heat the TFT layer for activating the TFT elements in the TFT layer;

Step 3: after the TFT elements in the TFT layer activated, disconnecting the two wires of the parallel combination from the power source to stop supplying the electricity to the parallel combination.

The TFT layer comprises a plurality of TFTs disposed correspondingly to the plurality of shielding metal blocks of the shielding metal layer, i.e., each TFT is correspondingly on top of a shielding metal block.

The TFT is a LTPS TFT.

The number of rows of shielding metal blocks in the plurality of parallel combinations is the same or different.

The shielding metal layer comprises m/2 parallel combinations, wherein each parallel combination comprises two rows of shielding metal blocks.

The present invention also provides an array substrate, which comprises: a bottom substrate, a shielding metal layer disposed on the bottom substrate, and a TFT layer disposed on the shielding metal layer;

the shielding metal layer comprising a plurality of shielding metal blocks arranged in a matrix of m rows, with the plurality of shielding metal blocks of each row connected through a wire;

in the m rows of shielding metal blocks, n rows forming a group, wherein 1≤n≤m, two wires being used to connected respectively the left ends and the right ends of the n rows of shielding metal blocks to form a plurality of parallel combinations, so that the two ends of each parallel combination having two outward extending wires, by connecting the two wires to a power source to supply electricity to the parallel combination to make the plurality of shielding metal blocks generating heat to pre-heat the TFT layer for improving activation speed of the TFT elements in the TFT layer;

wherein the TFT layer comprises a plurality of TFTs disposed correspondingly to the plurality of shielding metal blocks of the shielding metal layer, i.e., each TFT is correspondingly on top of a shielding metal block;

wherein the TFT is a LTPS TFT;

wherein the number of rows of shielding metal blocks in the plurality of parallel combinations is the same or different.

Compared to the known techniques, the present invention provides the following advantages: the present invention provides an array substrate and activation method for TFT elements in the array substrate. The array substrate comprises a shielding metal layer and a TFT layer disposed on the shielding metal layer; by connecting the shielding metal blocks on the shielding metal layer to electricity to heat up the shielding metal blocks for pre-heating the TFT layer to accelerate activating the TFT elements in the TFT layer. The activation method, by connecting the shielding metal blocks on the shielding metal layer to electricity to heat up the shielding metal blocks for pre-heating the TFT layer before activating the TFT elements in the TFT layer, accelerates activating the TFT elements in the TFT layer. The method is applicable to activating the TFT elements in array substrate in low temperature environment.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
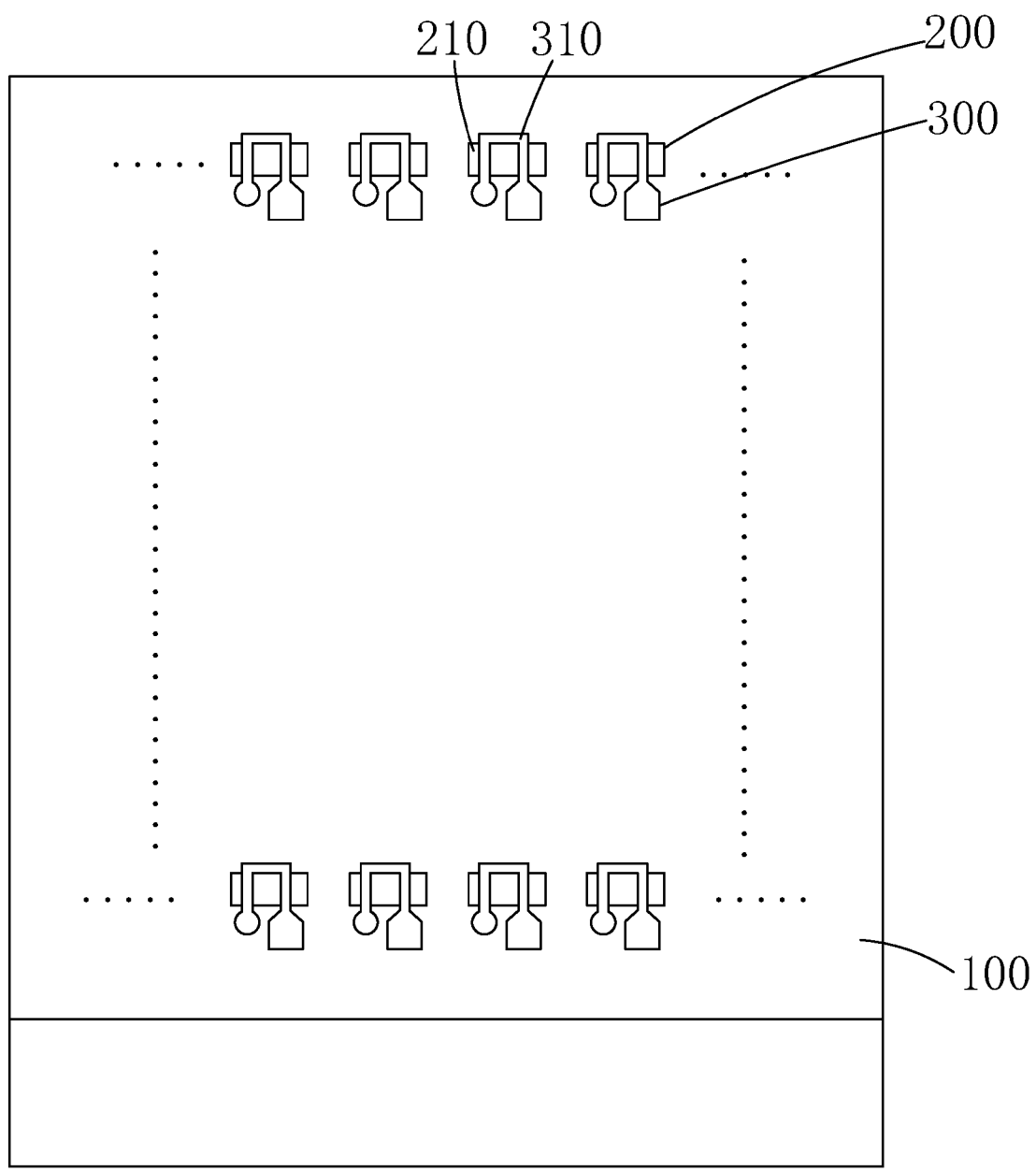
FIG. 1 is a schematic view showing the structure of a known array substrate of LCD panel.
Figure 2:
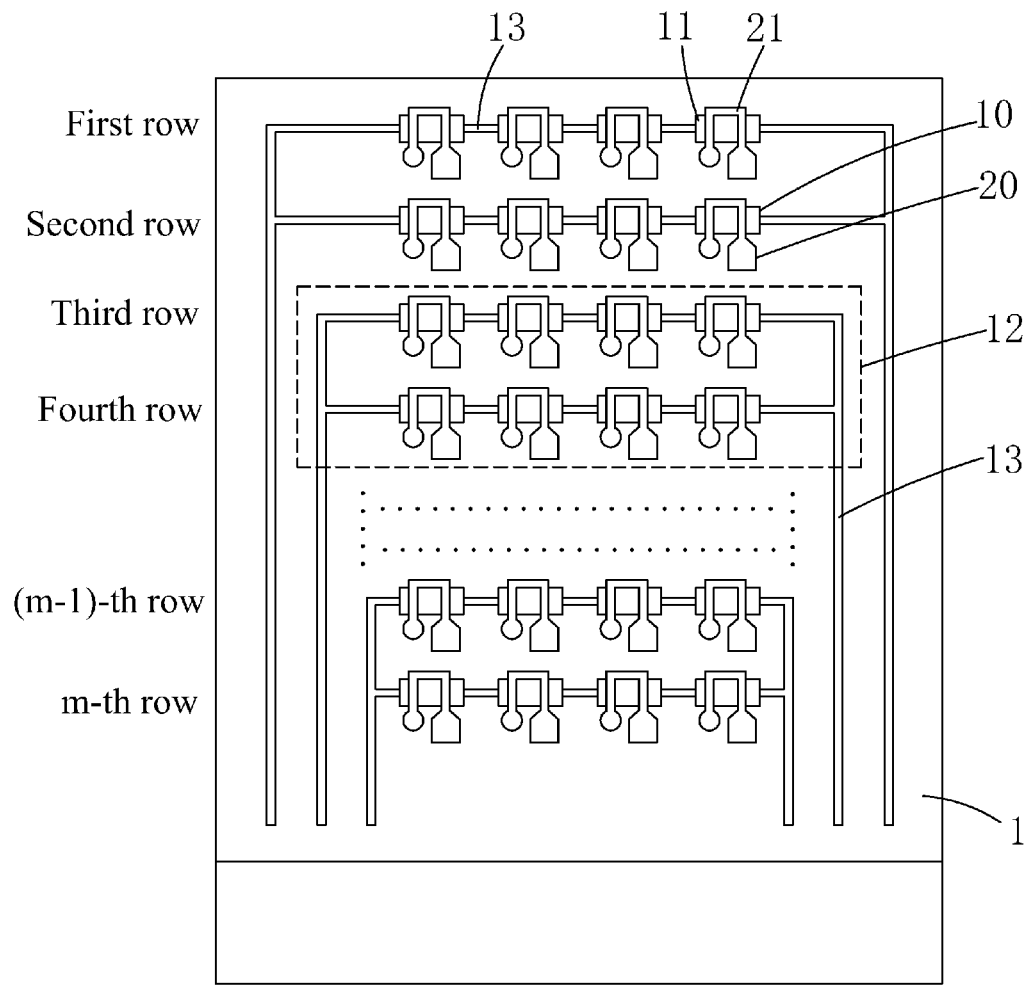
FIG. 2 is a schematic view showing the structure of an array substrate provided by an embodiment of the present invention.

Refer to FIG. 2. The present invention provides an array substrate, which comprises: a bottom substrate 1, a shielding metal layer 10 disposed on the bottom substrate 1, and a TFT layer 20 disposed on the shielding metal layer 10.

The shielding metal layer 10 comprises a plurality of shielding metal blocks 11 arranged in a matrix divided into m rows, with the plurality of shielding metal blocks 11 of each row connected through a wire 13.

In the m rows of shielding metal blocks 11, n rows forms a group, wherein 1≤n≤m, two wires 13 are used to connected respectively the left ends and the right ends of the n rows of shielding metal blocks 11 to form a plurality of parallel combinations 12, so that the two ends of each parallel combination 12 have two outward extending wires 13. By connecting the two wires 13 to a power source to supply electricity to the parallel combination 12 to make the plurality of shielding metal blocks 11 generating heat to pre-heat the TFT layer 20, the activation of the TFT elements in the TFT layer 20 is accelerated.

Specifically, the shielding metal blocks 11 serves as an equivalence of resistors. The resistor is able to generating heat when the connected to electricity. Specifically, when supplying electricity to the parallel combination 12 through wires 13, the voltage on the two ends of the shielding metal blocks 11 in each row is the same.

Specifically, the TFT layer 20 comprises a plurality of TFTs 21 disposed correspondingly to the plurality of shielding metal blocks 11 of the shielding metal layer 20, i.e., each TFT 21 is correspondingly on top of a shielding metal block 11. Specifically, the TFT 21 is a LTPS TFT.

Specifically, the number of rows of shielding metal blocks 11 in the plurality of parallel combinations 12 can be the same or different.

As shown in FIG. 2, the shielding metal layer 10 comprises m/2 parallel combinations 12, wherein each parallel combination 12 comprises two rows of shielding metal blocks 11.

The array substrate of the present invention comprises a shielding metal layer 10 and a TFT layer 20 disposed on the shielding metal layer 10. By connecting the shielding metal blocks 11 on the shielding metal layer 10 to electricity to heat up the shielding metal blocks 11 for pre-heating the TFT layer 20, the activation of the TFT elements in the TFT layer 20 is accelerated.

Figure 3:
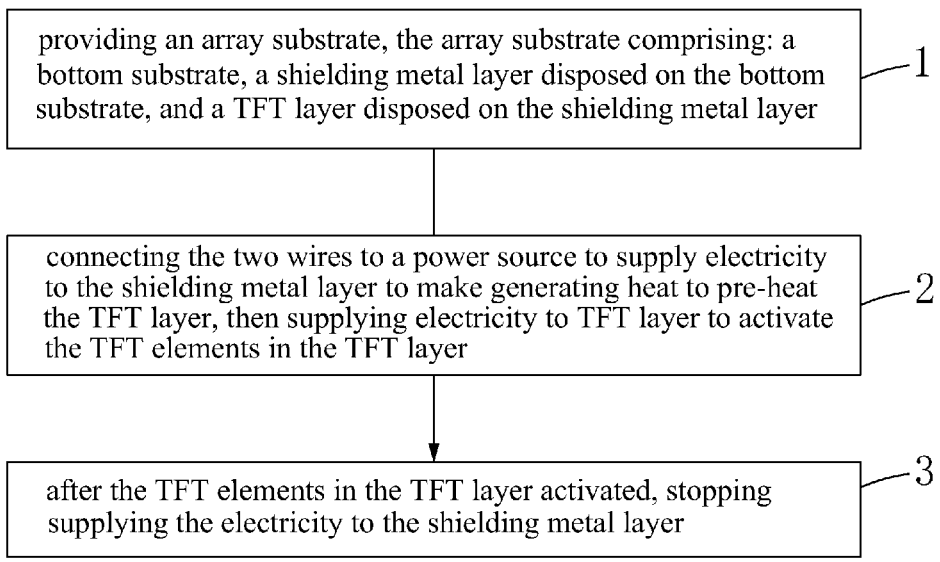
FIG. 3 is a schematic view showing the flowchart of the activation method for TFT elements in the array substrate provided by an embodiment of the present invention.

Refer to FIG. 3, as well as FIG. 2. The present invention also provides an activation method for TFT elements in array substrate, which comprises:

Step 1: providing an array substrate, the array substrate comprising: a bottom substrate 1, a shielding metal layer 10 disposed on the bottom substrate 1, and a TFT layer 20 disposed on the shielding metal layer 10.

The shielding metal layer 10 comprises a plurality of shielding metal blocks 11 arranged in a matrix divided into m rows, with the plurality of shielding metal blocks 11 of each row connected through a wire 13.

In the m rows of shielding metal blocks 11, n rows form a group, wherein 1≤n≤m, two wires 13 are used to connected respectively the left ends and the right ends of the n rows of shielding metal blocks 11 to form a plurality of parallel combinations 12, so that the two ends of each parallel combination 12 have two outward extending wires 13.

Specifically, the shielding metal blocks 11 serves as an equivalence of resistors. The resistor is able to generating heat when the connected to electricity.

Specifically, the TFT layer 20 comprises a plurality of TFTs 21 disposed correspondingly to the plurality of shielding metal blocks 11 of the shielding metal layer 20, i.e., each TFT 21 is correspondingly on top of a shielding metal block 11. Specifically, the TFT 21 is a LTPS TFT.

Specifically, the number of rows of shielding metal blocks 11 in the plurality of parallel combinations 12 can be the same or different.

As shown in FIG. 2, the shielding metal layer 10 comprises m/2 parallel combinations 12, wherein each parallel combination 12 comprises two rows of shielding metal blocks 11.

Step 2: connecting the two wires 13 to a power source to supply electricity to the parallel combination 12 to make the plurality of shielding metal blocks 11 generating heat to pre-heat the TFT layer 20 for activating the TFT elements in the TFT layer 20.

Specifically, when supplying electricity to the parallel combination 12 through wires 13, the voltage on the two ends of the shielding metal blocks 11 in each row is the same.

Step 3: after the TFT elements in the TFT layer 20 activated, disconnecting the two wires 13 of the parallel combination 12 from the power source to stop supplying the electricity to the parallel combination 12.

The activation method of the present invention, by connecting the shielding metal blocks 11 on the shielding metal layer 10 to electricity to heat up the shielding metal blocks 11 to pre-heat the TFT layer 20 before activating the TFT elements in the TFT layer 20, accelerates activating the TFT elements in the TFT layer 20. The method is applicable to activating the TFT elements in array substrate in low temperature environment.

In summary, the present invention provides an array substrate and activation method for TFT elements in the array substrate. The array substrate comprises a shielding metal layer 10 and a TFT layer 20 disposed on the shielding metal layer 10; by connecting the shielding metal blocks 11 on the shielding metal layer 10 to electricity to heat up the shielding metal blocks 11 for pre-heating the TFT layer 20 to accelerate activating the TFT elements in the TFT layer 20. The activation method, by connecting the shielding metal blocks 11 on the shielding metal layer 10 to electricity to heat up the shielding metal blocks 11 for pre-heating the TFT layer 20 before activating the TFT elements in the TFT layer 20, accelerates activating the TFT elements in the TFT layer 20. The method is applicable to activating the TFT elements in array substrate in low temperature environment.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An array substrate, which comprises: a bottom substrate, a shielding metal layer disposed on the bottom substrate, and a thin film transistor (TFT) layer disposed on the shielding metal layer;
   the shielding metal layer comprising a plurality of shielding metal blocks arranged in a matrix divided into m rows, with the plurality of shielding metal blocks of each row connected through a wire;
   in the m rows of shielding metal blocks, n rows forming a group, wherein 1≤n≤m, two wires being used to connected respectively the left ends and the right ends of the n rows of shielding metal blocks to form a plurality of parallel combinations, so that the two ends of each parallel combination having two outward extending wires, by connecting the two wires to a power source to supply electricity to the parallel combination to make the plurality of shielding metal blocks generating heat to pre-heat the TFT layer for accelerating activation of the TFT elements in the TFT layer.

2. The array substrate as claimed in claim 1, wherein the TFT layer comprises a plurality of TFTs disposed correspondingly to the plurality of shielding metal blocks of the shielding metal layer, i.e., each TFT is correspondingly on top of a shielding metal block.

3. The array substrate as claimed in claim 1, wherein the TFT is a low temperature poly silicon (LTPS) TFT.

4. The array substrate as claimed in claim 1, wherein the number of rows of shielding metal blocks in the plurality of parallel combinations is the same or different.

5. The array substrate as claimed in claim 1, wherein the shielding metal layer comprises m/2 parallel combinations, wherein each parallel combination comprises two rows of shielding metal blocks.

6. An activation method for thin film transistor (TFT) elements in array substrate, which comprises:
   Step 1: providing an array substrate, the array substrate comprising: a bottom substrate, a shielding metal layer disposed on the bottom substrate, and a TFT layer disposed on the shielding metal layer;
   the shielding metal layer comprising a plurality of shielding metal blocks arranged in a matrix divided into m rows, with the plurality of shielding metal blocks of each row connected through a wire;
   in the m rows of shielding metal blocks, n rows forming a group, wherein 1≤n≤m, two wires being used to connected respectively the left ends and the right ends of the n rows of shielding metal blocks to form a plurality of parallel combinations, so that the two ends of each parallel combination having two outward extending wires;
   Step 2: connecting the two wires to a power source to supply electricity to the parallel combination to make the plurality of shielding metal blocks generating heat to pre-heat the TFT layer for activating the TFT elements in the TFT layer;
   Step 3: after the TFT elements in the TFT layer activated, disconnecting the two wires of the parallel combination from the power source to stop supplying the electricity to the parallel combination.

7. The activation method for TFT elements in array substrate as claimed in claim 6, wherein the TFT layer comprises a plurality of TFTs disposed correspondingly to the plurality of shielding metal blocks of the shielding metal layer, i.e., each TFT is correspondingly on top of a shielding metal block.

8. The activation method for TFT elements in array substrate as claimed in claim 6, wherein the TFT is a low temperature poly silicon (LTPS) TFT.

9. The activation method for TFT elements in array substrate as claimed in claim 6, wherein the number of rows of shielding metal blocks in the plurality of parallel combinations is the same or different.

10. The activation method for TFT elements in array substrate as claimed in claim 6, wherein the shielding metal layer comprises m/2 parallel combinations, wherein each parallel combination comprises two rows of shielding metal blocks.

11. An array substrate, which comprises: a bottom substrate, a shielding metal layer disposed on the bottom substrate, and a thin film transistor (TFT) layer disposed on the shielding metal layer;

the shielding metal layer comprising a plurality of shielding metal blocks arranged in a matrix divided into m rows, with the plurality of shielding metal blocks of each row connected through a wire;

in the m rows of shielding metal blocks, n rows forming a group, wherein 1≤n≤m, two wires being used to connected respectively the left ends and the right ends of the n rows of shielding metal blocks to form a plurality of parallel combinations, so that the two ends of each parallel combination having two outward extending wires, by connecting the two wires to a power source to supply electricity to the parallel combination to make the plurality of shielding metal blocks generating heat to pre-heat the TFT layer for accelerating activation of the TFT elements in the TFT layer;

wherein the TFT layer comprises a plurality of TFTs disposed correspondingly to the plurality of shielding metal blocks of the shielding metal layer, i.e., each TFT is correspondingly on top of a shielding metal block;

wherein the TFT is a low temperature poly silicon (LTPS) TFT;

wherein the number of rows of shielding metal blocks in the plurality of parallel combinations is the same or different.

12. The array substrate as claimed in claim 11, wherein the shielding metal layer comprises m/2 parallel combinations, wherein each parallel combination comprises two rows of shielding metal blocks.

\* \* \* \* \*